United States Patent
Biber et al.

(10) Patent No.: US 6,260,610 B1
(45) Date of Patent: Jul. 17, 2001

(54) CONVOLUTED FIN HEAT SINKS WITH BASE TOPOGRAPHY FOR THERMAL ENHANCEMENT

(75) Inventors: Catharina R. Biber, Tigard, OR (US); Vincent Campanella, Wakefield, MA (US)

(73) Assignee: Thermal Form & Function, Kenton, OH (US)

( * ) Notice: Subject to any disclaimer, the term of this patent is extended or adjusted under 35 U.S.C. 154(b) by 0 days.

(21) Appl. No.: 09/262,907

(22) Filed: Mar. 5, 1999

Related U.S. Application Data

(60) Provisional application No. 60/077,163, filed on Mar. 6, 1998.

(51) Int. Cl.[7] .................................................. H05K 7/20
(52) U.S. Cl. ......................... 165/80.3; 361/704; 361/710
(58) Field of Search ............................... 165/80.3, 185; 361/704, 710; 257/722; 174/16.3

(56) References Cited

U.S. PATENT DOCUMENTS 5,771,966 * 6/1998 Jacoby ................................ 165/185
5,791,406 * 8/1998 Gönner et al. ...................... 165/185
6,000,462 * 8/1998 Gönner ............................... 165/80.3

OTHER PUBLICATIONS

"Convoluted Fin Heat Sinks" from Wakefield Engineering website at: http://www.wakefield.com/products/convoluted.htm and a data sheet at: http://www.wakefield.com/products/folded%20fin.pdf dated 1998.*

* cited by examiner

Primary Examiner—Allen Flanigan
(74) Attorney, Agent, or Firm—Barbara Joan Haushalter

(57) ABSTRACT

A system and method are provided for enhancing thermal performance of a heat transfer device. A fin pack is generated from a flat sheet of metal, the fin having a plurality of radiussed conduit top portions and a reciprocal plurality of radiussed conduit bottom portions, for transferring heat. The radiussed conduit bottom portions of the fin are attached to a base plate. The base plate comprises a series of grooves and risers for closely approximating the shape of the radiussed conduit portions. The radiussed fin portions nest in the configuration of grooves and risers to maximize the contact area between the fin and the base plate.

9 Claims, 3 Drawing Sheets

CONVOLUTED FIN HEAT SINKS WITH BASE TOPOGRAPHY FOR THERMAL ENHANCEMENT

RELATED APPLICATIONS

This is a regularly filed application, based on provisional application Ser. No. 60/077,163, filed Mar. 6, 1998.

BACKGROUND OF THE INVENTION

The present invention relates to heat transfer devices and, more particularly, to the thermal performance and manufacturability of convoluted fin heat sinks.

Heat transfer devices, such as heat sinks and heat exchangers, are widely used for absorptive thermal protection. To achieve this, heat transfer devices are made of various types of corrugated fin material to allow energy transfer during passage of air and/or fluid through the device.

Compact, lightweight heat dissipators have become increasingly important with the constant trend of microprocessor and electronic device miniaturization. Traditionally, the highest performing heat sinks comprise thin folded fin structures for heat dissipation and a flat base, providing structural support for the assembly, as well as the interface to the electronic device. Such heat sinks are generally considered to have excellent performance, but at a very high cost. The high cost comes in part from the labor-intensive process of fixturing the fin and base assembly for precise alignment during the joining procedure. However, with electronic devices becoming ubiquitous, cost pressure virtually excludes traditional convoluted fin heat sinks from wide commercial use.

The long-used thin, lightweight convoluted fin for typical heat exchangers and dissipators is folded into a square wave shape with squared or rounded corners. In most cases, the structural base is a planar element with smooth surfaces. The interface between the fin and the base is a narrow contact area at the trough of the wave. When the fins are thin, the interface covers only a very narrow area. Furthermore, although a perfectly square wave shape will encourage higher contact with the base plate than a rounded or radiussed wave shape, perfectly squared corners at the trough of the fin material wave are unrealistic for the material used in fin forming.

It is known in the art that heat transfer can be improved in various applications by increasing the surface area of the fin material. The surface area of the fin material can be increased by either increasing the height of the fin material; increasing the number of fins per inch of the fin material; or increasing the width or flow length of the fluid along the fin. However, each of these improvements has tangible limits. For example, the part incorporating the fin material typically has a height and width limitation, which the fin material must adhere to in order to fit in the part. This is particularly the case with compact parts such as medical equipment, space applications, and computers, where increasing the size of the fin material and, therefore, the heat transfer device, is extremely undesirable. Additionally, increases in the height and/or width of the fin material does not create a directly proportional increase in the performance or efficiency of the heat transfer device. The other improvement technique, increasing the number of fins per inch, is theoretically sound, but realistically limited. The number of fins per inch is limited by the performance and ability of the corrugation means for corrugating the fin material.

It would be desirable, therefore, to have a fin heat sink with improved thermal performance and ease of assembly, without requiring a consequent increase in the surface area of the fin material.

SUMMARY OF THE INVENTION

This need is met by the fin heat sink of the present invention, wherein a base topography is proposed to enhance thermal performance of the fin heat sink by maximizing the contact area between the fin trough and the base plate. The base topography configuration of the present invention improves the heat transfer capability of the heat transfer device incorporating the fin material. Generating a heat sink according to the present invention provides a heat transfer device having increased contact area and, consequently, improved thermal performance, without increasing the height, width, or number of fins per inch.

In accordance with one aspect of the present invention, an improved heat transfer device comprises a fin generated from a flat sheet of metal, the fin having a plurality of radiussed conduit top portions and a reciprocal plurality of radiussed conduit bottom portions, for transferring heat. The radiussed conduit bottom portions of the fin are attached to a base plate. The base plate comprises a series of grooves and risers for closely approximating the shape of the radiussed conduit portions. The radiussed fin portions nest in the configuration of grooves and risers to maximize the contact area between the fin and the base plate.

The present invention also includes a method for improving heat transfer. The method comprises the steps of providing a sheet of metal and forming a plurality of corrugations in the metal to generate a fin pack. Certain of the troughs of the fin pack are then received by and nested within a combination of a plurality of grooves and risers associated with the topographical configuration of a base plate, creating a heat sink with improved thermal performance.

Accordingly, it is an object of the present invention to provide an improvement in the thermal performance of a heat transfer device. It is also an object of the present invention to provide such an improvement wherein the volume of space required for the heat transfer device is not increased. It is a further object to provide such an improvement wherein thermal impedance of the joining area between the fin and the base plate is minimized by maximizing the contact area between the fin and the base plate.

Other objects and advantages of the invention will be apparent from the following description, the accompanying drawings and the appended claims.

DETAILED DESCRIPTION OF THE PREFERRED EMBODIMENTS

Figure 1A:
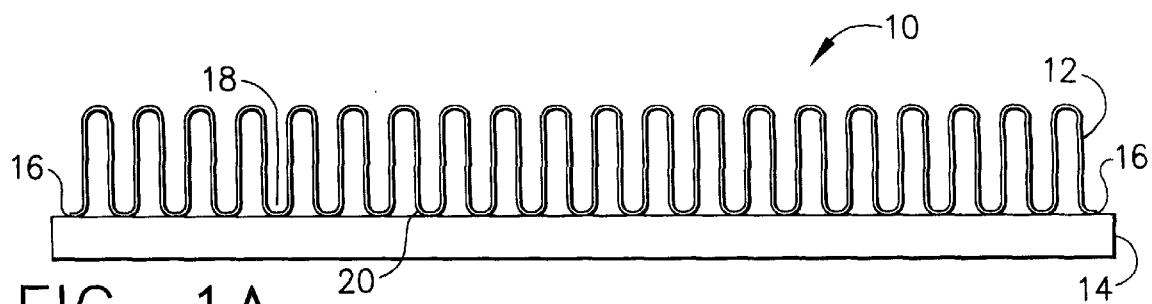
FIG. 1A is a side view of a fin material attached to a base plate to create a prior art convoluted fin heat sink.
Figure 1B:
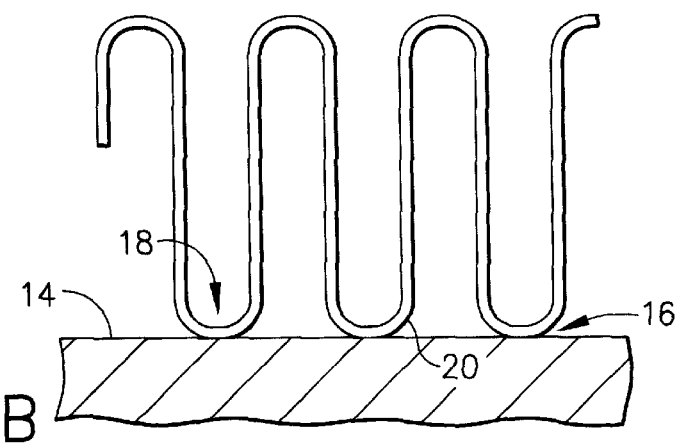
FIG. 1B is an enlarged view of a portion of the heat sink of FIG. 1A, to illustrate the interface between the fins and the base plate of the heat sink of FIG. 1A.

The present invention provides for a significant enhancement to both the thermal performance and manufacturability of convoluted fin heat sinks. Referring to the drawings, there is illustrated in FIG. 1A, a traditional heat sink 10, wherein fin material 12 is attached to a base plate 14. As best illustrated in the magnified section of FIG. 1B, the interface 16 between the fin 12 and the base plate 14 is a narrow contact area at a trough 18 of the wave or radius portion 20 of fin 12. The actual contact between the base plate 14 and the fin 12 is the very small deepest region of the trough 18, at the bottom of the downward extension of fin, and as the fin curves to extend back upward.

Figure 2A:
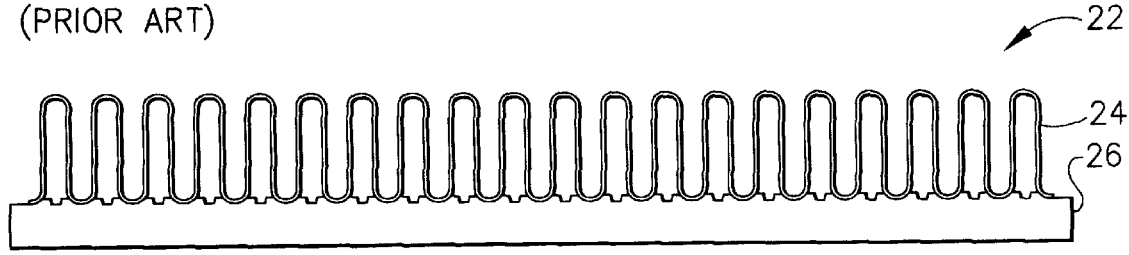
FIG. 2A is a side view of a fin material attached to a base plate to create a convoluted fin heat sink manufactured in accordance with the present invention.
Figure 2B:
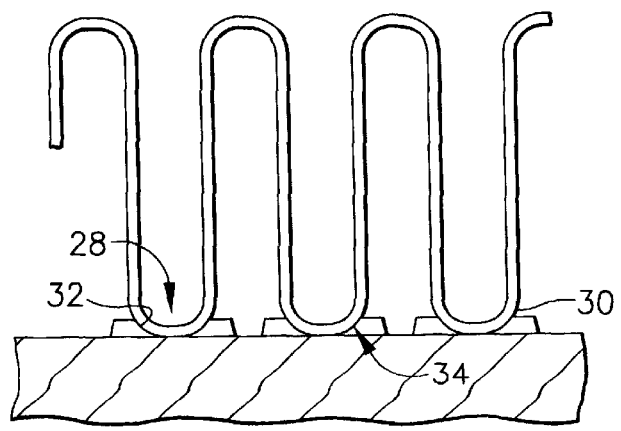
FIG. 2B is an enlarged view of a portion of the heat sink of FIG. 2A, to illustrate the improved interface between the fins and the base plate of the heat sink of FIG. 2A.

Referring now to FIGS. 2A and 2B, there is illustrated a heat sink 22 constructed in accordance with the present invention. In FIG. 2, fin heat sink 22 is comprised of fin material 24 and a base plate 26. The topography of base plate 26 is uniquely configured to conform to the convoluted shape of the trough 28 of fin 24, actually extending a finite height above the plane of the bottom wave or radius conduits 30 of the fin, for transferring heat. This finite height may be any desired height, and can be selected to optimize or satisfy the particular requirements of the application, for example between 1 and 4 mm. When determining an optimum height, it is noted that as the height increases, it can become tall enough to block airflow, which can be an undesirable effect. This finite height extension 32 allows the trough 28 to nest in the base plate topography, thereby maximizing the contact area or interface 34 between the fin 24 and the base plate 26.

Figure 3:
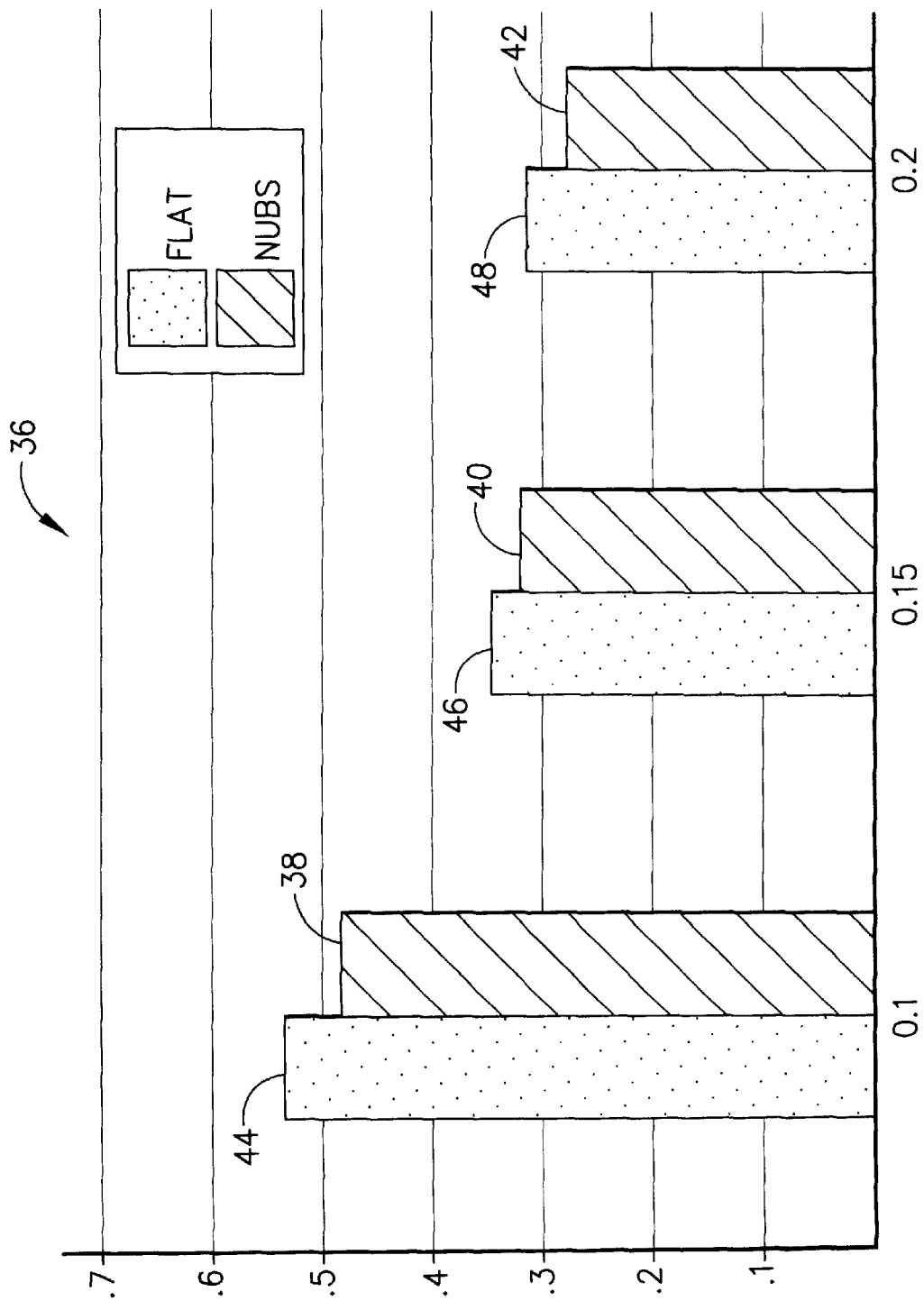
FIG. 3 is a graphical representation showing pressure drop versus thermal resistance, to compare the thermal performance of the heat sinks illustrated in FIGS. 1A and 2A.

By maximizing the contact area 34, the unique construction of the base plate 26 thereby minimizes the thermal impedance of the joining area 34. This minimized thermal resistance is illustrated in graph 36 of FIG. 3, which shows pressure drop versus thermal resistance, to compare the thermal performance (measuring thermal resistance (in degrees Celsius/Watt) versus pressure drop (in inches of water column) of heat sink 10 and heat sink 22. Specifically, the thermal resistance of heat sink 22, represented by 38, 40 and 42, is always less than the thermal resistance of heat sink 10, represented by 44, 46 and 48. An improvement of up to, for example, a 10% drop in thermal resistance has been realized with the configuration of the present invention.

The increased contact area and the unique configuration of base plate 26 allow precise placement and orientation of the fins 24 on the base 26. Larger frictional forces also ensure stability of the placement during the thermal excursions typical of the joining process. As will be realized by those skilled in the art, although the convoluted fin pack 24 is typically fixed to the base 26 by means of a thermally conductive adhesive, any suitable means can be applied, including for example ultrasonic bonding, roll bonding, resistance welding, brazing, soldering, and mechanical attachment.

The base 26 can be made from, for example, extruded straps of heat conductive material such as aluminum. The novelty of the base plate 26 lies in the topographical contours. As illustrated in FIGS. 4A, 4B, 5A and 5B, the base plate topograhical region is comprised of a plurality of grooves 50 and risers 32 for receiving one or more of the troughs 28 of the convoluted fin pack 24. The heat sink would preferably be oriented toward the most airflow, so the fins can be configured in a longitudinal (FIG. 4B) or transverse (FIG. 5B) flow arrangement.

Figure 4A:
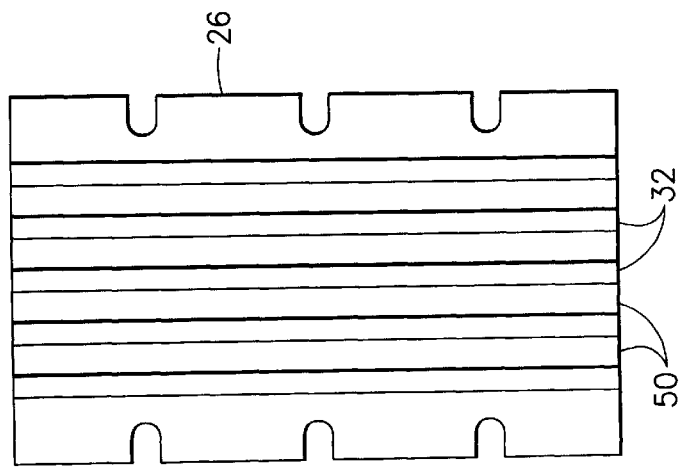
FIGS. 4A and 4B are top and end views, respectively, of one embodiment of a base plate constructed in accordance with the present invention, wherein grooves and risers in the base plate receive and nest the radiussed fin troughs of a corrugated fin material.
Figure 5A:
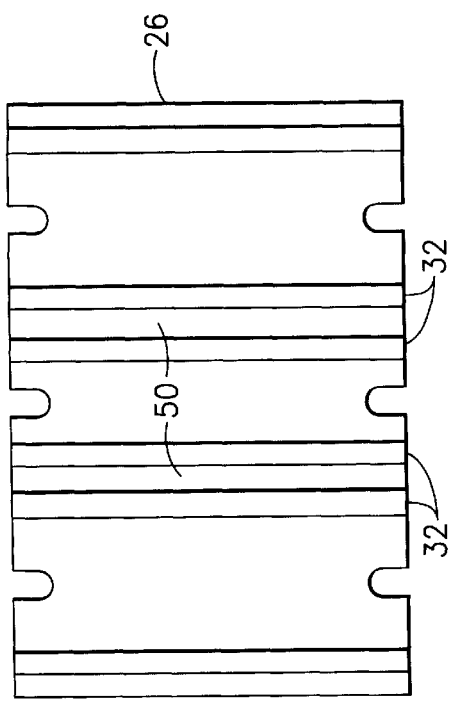
FIGS. 5A and 5B are top and end views, respectively, of an alternative embodiment of a base plate constructed in accordance with the present invention, wherein the number of grooves and risers can vary, as compared to the embodiment of FIGS. 4A and 4B.
Figure 4B:
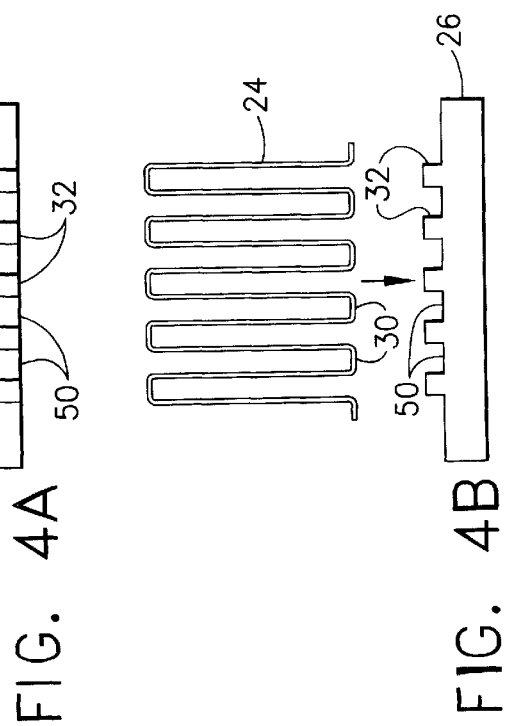
Figure 5B:
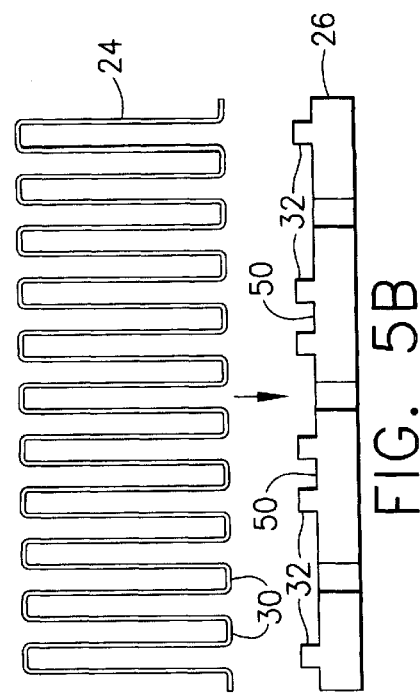

Those skilled in the art will recognize that the actual pattern, arrangement, or number of grooves and ridges can vary without departing from the scope of the invention. For example, the number of grooves and risers can be spaced evenly and/or symmetric along the plate 26, as illustrated in FIGS. 4A and 4B. Alternatively, the space between the grooves 50 and/or risers 32 can vary, as illustrated in FIGS. 5A and 5B. Hence, the arrangement can be patterned or random, and the number of grooves and risers can be greater than, equal to or less than the number of radiussed conduit portions. Any number and configuration of grooves and risers is acceptable and capable of improving thermal performance of the heat sink 22, as long as the configuration, spacing and layout allows for the mating of the radiussed sections 30 of fin 24 within some combination of grooves and risers. Of course, thermal performance can still be enhanced even without nesting each individual radiussed section 30 in a separate groove 52, as illustrated in FIGS. 5A and 5B. Furthermore, the dimensions of the grooves and risers can be standard across a base plate, or can vary across a base plate, as desired.

While the invention has been described with reference to certain preferred embodiments thereof, it will be understood by those skilled in the art that various changes may be made and equivalents may be substituted for elements, arrangements and configurations thereof without departing from the scope of the invention. In addition, many modifications may be made to adapt a particular situation or material to the teachings of the invention without departing from the essential scope thereof. Therefore, it is intended that the invention not be limited to any particular embodiment disclosed, but that the invention will include all embodiments falling within the scope of the appended claims.

What is claimed is:

1. An improved heat transfer device comprises:

a fin generated from a flat sheet of metal, the fin having a plurality of radiussed conduit top portions and a reciprocal plurality of radiussed conduit bottom portions, for transferring heat;

a base plate for attachment to the radiussed conduit bottom portions of the fin, the base plate including a random arrangement of grooves and risers for closely approximating the radiussed conduit portions; and a bonding agent applied to the bottom of the fin for affixing the fin to the base plate, whereby the bonding agent allows the radiussed conduit bottom portions of the fin to nest in the plurality of grooves and risers to maximize a contact area between the fin and the base plate.

2. An improved heat transfer device as claimed in claim 1 wherein the random arrangement of grooves and risers comprises an evenly spaced random arrangement of grooves and risers.

3. An improved heat transfer device as claimed in claim 1 wherein the random arrangement of grooves and risers can be a quantity greater than, equal to or less than the number of radiussed conduit portions.

4. An improved heat transfer device as claimed in claim 1 wherein each of the risers extend between one and four mm above the plurality of grooves.

5. An improved heat transfer device as claimed in claim 1 wherein the fin is folded into an approximate square wave shape with generally rounded corners.

6. A method for improving heat transfer, comprising the steps of:

providing a sheet of metal;

forming a plurality of corrugations in the metal to generate a fin pack defined by an approximate square wave shape with radiussed portions;

providing a base plate;

applying a bonding agent to a bottom surface of the fin pack to attach a selected plurality of the radiussed portions of the fin pack to the base plate;

defining a random arrangement of grooves and risers at a joining surface of the bonding agent between the fin pack and the base plate to receive and nest one or more of the selected plurality of radiussed portions.

7. A method as claimed in claim 6 wherein the step of defining a random arrangement of grooves and risers further comprises the step of allowing for any number and configuration for the grooves and risers.

8. A method as claimed in claim 6 wherein each of the risers extend between one and four mm above the plurality of grooves.

9. A method as claimed in claim 6 further comprising the step of folding the fin into an approximate square wave shape.

* * * * *